(12) United States Patent
Traut et al.

(10) Patent No.: US 7,623,555 B2
(45) Date of Patent: Nov. 24, 2009

(54) HIGH POWER SEMICONDUCTOR LASER DIODE

(75) Inventors: Silke Traut, Niederlenz/Zurich (CH); Berthold Schmidt, Erlenbach/Zurich (CH); Boris Sverdlov, Adliswil/Zurich (CH); Achim Thies, Zurich (CH)

(73) Assignee: Oclaro Technology plc, Northamptonshire (GB)

( * ) Notice: Subject to any disclaimer, the term of this patent is extended or adjusted under 35 U.S.C. 154(b) by 139 days.

(21) Appl. No.: 11/972,156

(22) Filed: Jan. 10, 2008

(65) Prior Publication Data

US 2008/0123697 A1 May 29, 2008

Related U.S. Application Data

(63) Continuation of application No. 11/040,246, filed on Jan. 21, 2005, now abandoned, which is a continuation-in-part of application No. 10/245,199, filed on Sep. 17, 2002, now Pat. No. 6,862,300.

(51) Int. Cl.
*H01S 3/098* (2006.01)
*H01S 3/113* (2006.01)
*H01S 5/00* (2006.01)

(52) U.S. Cl. ............................ 372/19; 372/11; 372/18; 372/45.013

(58) Field of Classification Search .................. 372/11, 372/18, 19, 43.01, 45.013, 54
See application file for complete search history.

(56) References Cited

U.S. PATENT DOCUMENTS 4,227,975 A 10/1980 Hartman et al.

(Continued)

FOREIGN PATENT DOCUMENTS

EP 0 270 170 11/1987

(Continued)

OTHER PUBLICATIONS

Pawlik et al., "Ultra-High Power RWG Laser Diodes with Lateral Absorber Region", Sep. 29, 2002, pp. 163-164.

(Continued)

*Primary Examiner*—Armando Rodriguez
(74) *Attorney, Agent, or Firm*—Renner, Otto, Boisselle & Sklar, LLP

(57) ABSTRACT

Semiconductor laser diodes, particularly high power ridge waveguide laser diodes, are often used in opto-electronics as so-called pump laser diodes for fiber amplifiers in optical communication lines. To provide the desired high power output and stability of such a laser diode and avoid degradation during use, the present invention concerns an improved design of such a device, the improvement concerns a method of suppressing the undesired first and higher order modes of the laser which consume energy and do not contribute to the optical output of the laser, thus reducing it's efficiency. This novel effect is provided by a structure comprising CIG—for Complex Index Guiding—elements on top of the laser diode, said CIG being established by fabricating CIG elements consisting of one or a plurality of layers and containing at least one layer which provides the optical absorption of undesired modes of the lasing wavelength. This CIG preferably contains an insulating layer as a first contact layer to the semiconductor. The CIG elements are manufactured by a selected sequence of processing steps, in particular several masking steps, and are specifically shaped, both in thickness and coverage of the laser's semiconductor body, to provide desired suppression characteristics. Further, the CIG elements may be combined with the contact layer usually providing the electrical input power to the laser diode.

25 Claims, 11 Drawing Sheets

U.S. PATENT DOCUMENTS

| | | | |
|---|---|---|---|
| 4,807,235 | A | 2/1989 | Suyama et al. |
| 6,366,595 | B1 | 4/2002 | Bowler |
| 6,711,197 | B2 | 3/2004 | Tojo et al. |
| 2002/0159494 | A1 | 10/2002 | Tojo et al. |

FOREIGN PATENT DOCUMENTS

| | | |
|---|---|---|
| JP | 57-026488 | 2/1982 |
| JP | 5-021902 | 1/1993 |
| JP | 2003-034595 | 2/2003 |

OTHER PUBLICATIONS

International Search Report regarding International Application No. PCT/IB03/03929 mailed Dec. 17, 2003.

HIGH POWER SEMICONDUCTOR LASER DIODE

This application is a continuation of U.S. application Ser. No. 11/040,246 filed on Jan. 21, 2005, now abandoned which is a continuation-in-part of U.S. application Ser. No. 10/245,199, filed Sep. 17, 2002 now U.S. Pat. No. 6,862,300, and is incorporated herein by reference in its entirety.

DESCRIPTION

1. Field of the Invention

This invention relates to semiconductor laser diodes, in particular to ridge waveguide (RWG) diodes, and a method for making such diodes. RWG laser diodes are especially used as pump lasers in fiber optic networks and similar applications since they provide the desired narrow-bandwidth optical radiation with a stable light output power in a given frequency band. Naturally, output power and stability of such laser diodes are of crucial interest. The present invention relates to an improved method for making such a laser diode, i.e. an improved manufacturing process, the improvement in particular concerning the structure and design of the laser diode; it also relates to laser diodes manufactured by such an improved process.

2. Background of the Invention

Coupling light of a semiconductor laser diode into an optical fiber is a central problem within the field of optical networks, in particular when high power transmission/coupling is desired. Due to increasing channel density in DWDM (Dense Wavelength Division Multiplexing) long haul networks, and the power requirements at elevated temperatures in metro networks, maximizing the laser diode's operating light output power is a primary design criterion. The useful operating power is mainly limited by a "kink" in the L-I curves, i.e. the light output over current curves, indicating a beam steering in lateral direction. The occurrence of such a kink is influenced by the real refractive index step, the gain profile as well as spatial hole burning and local heating in the laser diode. Depending on the device structure, the laser diode suffers at a certain power level from the resonance between the fundamental mode and higher order modes in lateral direction. This has been shown by J. Guthrie et al in "Beam instability in 980 nm power lasers: Experiment and Analysis" in IEEE Pot. Tech. Lett. 6(12), 1994, pp. 1409-1411. Generation of higher order modes is highly undesirable since efficient laser to fiber coupling is only possible with the fundamental mode.

Since weakly guided semiconductor devices like ridge waveguide (RWG) laser diodes are preferred for high power applications, as shown by B. E. Schmidt et al in "Pump laser diodes", Optical Filter Telecommunications IVA, Editors: Kaminov and Li, Academic Press, 2002, ISBN 0-12-395172-0, pp. 563-586, an improvement in RWG designs appears highly desirable.

Bowler U.S. Pat. No. 6,141,365 describes a semiconductor laser with a kink suppression layer. Reportedly, the latter limits the establishment of higher order lateral modes and thus increases the kink power of the device. Bowler also discloses disposing an optical layer along the optical axis of an RWG laser on both sides of the laser's ridge. However, shape and size of this kink suppression layer is essentially determined by the photoresist mask used to form the ridge. Bowler does not address utilizing the kink suppression layer's shape, thickness, and/or material for any particular purpose apart from general kink suppression. Also, the lasers described by Bowler have output powers of no more than 200 to 300 mW which is insufficient for many of today's technical applications.

Thus, it is a general object of this invention to devise a reliable design for a high power RWG laser diode which in particular provides a stable light output under all operating conditions and a sufficiently long life of such laser diodes. Hereinbelow, the term "high power" is used for an optical output power approximating 1 W. Laser diodes with 918 mW linear kink-free power have been realized with a design according to the present invention.

It is a further primary object of this invention to provide an advantageous and economical manufacturing method for a novel high power RWG laser diode, allowing reliable mass production of such laser diodes.

It is a more specific object of this invention to provide a RWG laser diode design optimally suited for realizing laser diodes with kink-free output powers in the 1 W region, and an increase of about 25% in median linear power (taken over about 700 devices) compared to a standard design.

DISCLOSURE OF THE INVENTION

The principal design idea of the invention is to develop a structure of a high power RWG laser diode which controllably introduces additional optical losses for first and higher order modes, whereas the fundamental (or 0th order) mode experiences only minor influences.

It is known that high order lateral modes, e.g. the first order mode, exhibit a broader extension of the optical field in lateral direction than the fundamental mode. In other words, the lateral extension of the desired fundamental mode is smaller than that of the undesirable first order and higher order modes. These undesired modes can be suppressed by introducing optically absorbing regions parallel to the ridge waveguide.

Hence, depending on the location, an absorbing layer can function as a suppression layer for the first and higher order modes, without introducing significant absorption of the fundamental mode.

Due to the increased loss in the first order mode, resonant coupling occurs at much higher power levels and hence the linear power, i.e. the kink-free power, of the laser diode is significantly increased. Since attenuation of first and higher order modes is stronger than the same for the fundamental mode, this layer acts as a mode-discrimination element.

The absorption layer can be made of any material in which the imaginary part of the complex index of refraction is not zero for the wavelength in question, i.e. the lasing wavelength. The element that discriminates first and higher order modes can be a single layer or contain multiple layers, where at least one layer must have the desired absorption properties. Number and location of these mode-discrimination elements (or Complex Index Guiding, CIG, elements) within the laser diode structure as well as shape and number of layers contained within the element depend on the laser design and have to be individually optimized.

The improvement achieved by adding CIG elements to a standard RWG structure can be demonstrated. The linear power for a laser diode with CIG elements as described is significantly higher than for a similar standard laser diode. In one trial embodiment of a laser diode according to the invention, about 900 mW kink-free light output power was reached at an operating current of around 1.1 A. The median linear, i.e. kink-free, power taken over about 700 laser diodes increased by about 25% for laser diode structures containing CIG elements compared to standard diodes.

In a first series of experiments, the photoresist etching mask already used for ridge etching was employed as mask for RIE etching the insulating layer, similar to the method described by Bowler in U.S. Pat. No. 6,141,365, cited above.

The insulating layer at both sides of the ridge was etched down to the semiconductor. Subsequently, the p-contact metallisation (Ti/Pt/Au) was deposited. The Ti layer of the metallisation functioned as the optically absorbing layer, i.e. the CIG element, in this case. Depending on the laser design, the linear power was increased anywhere from 10% to 20%. At the same time, the efficiency decreased by 10% to 20%, indicating significant absorption of the fundamental mode.

In further experiments, the design was improved by laterally varying the distance of the CIG elements relative to ridge and herewith the extension of the modes. The purpose of this variation is to optimize absorption of higher order modes relative to the fundamental mode and thus optimize linear power and minimize efficiency losses. Furthermore, a thin insulating layer was added to the CIG element. This layer is electrically insulating and does not absorb light of the lasing wavelength. It is located between the semiconductor body and the absorption layer. The overall absorption now not only depends on the material of the absorption layer and the location of the CIG element, but also on the thickness of this insulating layer, i.e. the vertical distance of the modes from the absorption layer. Additionally, the insulator electrically separates the absorption layer, which is a conductor in the present case, from the semiconductor and thus eliminates the possibility of leaking currents.

These variations rendered very interesting results and thus form an essential part of this invention. They will be described in detail later. In three variations, the CIG elements were located at 0, 300, and 600 nm distance relative to both sides of the ridge, i.e. measured from ridge etching mask. The thin insulating layer, here $Si_3N_4$, was part of the CIG elements for all experiments and had a thickness of about 25 nm. On average, the linear power of these laser diodes increased by about 25% relative to laser diodes without CIG elements. Relative to standard laser diodes, the average efficiency was reduced by about 10% for lasers, where the CIG elements were located right next to the ridge, i.e. at 0 nm from ridge etching mask. For the two designs where the CIG elements were taken further from the ridge, i.e. 300 nm and 600 nm relative to the ridge etching mask, the efficiency was reduced by only about 5%.

In one embodiment, the lateral and vertical far-field show stable single mode outputs above 900 mW and no lateral beam steering was observed in the whole power range.

The three experimentally evaluated locations of the CIG elements show clearly that optimization reduces the detrimental effect on the fundamental mode and thus increases the efficiency and kink power even further.

The laser diodes with the improved CIG design were tested under accelerated conditions for stability, failures and degradation. The CIG-improved lasers showed stable performance, indicating highly reliable operation. No distinctive features were observed compared to standard laser diodes. The operating conditions were 900 mA constant current at 85° C. heat sink temperature, 3000 hrs.

To summarize, the invention concerns a process for making a novel high power ridge waveguide semiconductor laser design containing one or more CIG elements (Complex Index Guiding elements). These CIG elements consist of at least one layer that absorbs light of the lasing wavelength, but may contain a plurality of absorbing and non-absorbing layers. The novel laser exhibits high stability with increased kink power. The CIG elements are preferably located to both sides of the ridge along the optical axis. Precise location and shape of the CIG element as well as number and location of layers in the CIG element depend on the laser design and are chosen to achieve maximum efficiency and/or maximum kink power.

The novel manufacturing process according to the invention allows control of the distance relative to the extension of fundamental and first order modes and hence optimization of increased kink power vs. optical losses. Experimental results show an increased kink power of about 25% (median) and very good life-time results.

As already addressed, the position of the absorbing layer relative to the fundamental mode is rather critical. This is due to the fact that absorption of the first order mode is desired, but absorption of the fundamental mode is undesirable since it results in reduced efficiency. The described novel manufacturing method allows control of the distance of the absorbing layer relative to the ridge by a self-aligning process. This optimizes the kink power increase by absorption of the first order mode without significantly loosing efficiency by absorption of the fundamental mode. Since the location of the CIG elements can be defined independently of the ridge and its etching mask, any epitaxial design and any ridge design can be used.

The fabrication method according to the invention has the further advantage that it does not put limitations on the CIG elements in terms of position, thickness, material and deposition method. Also, the novel method facilitates the introduction of a thin insulating layer underneath the absorption layer to electrically separate the semiconductor from the metal and thus avoid leaking currents and to modify the overall absorption.

DETAILED DESCRIPTION OF PREFERRED EMBODIMENTS

In the following, various embodiments of the invention, including some basic considerations and both the laser structure and the manufacturing process, shall be described by reference to the drawings, in which.

Figure 1:
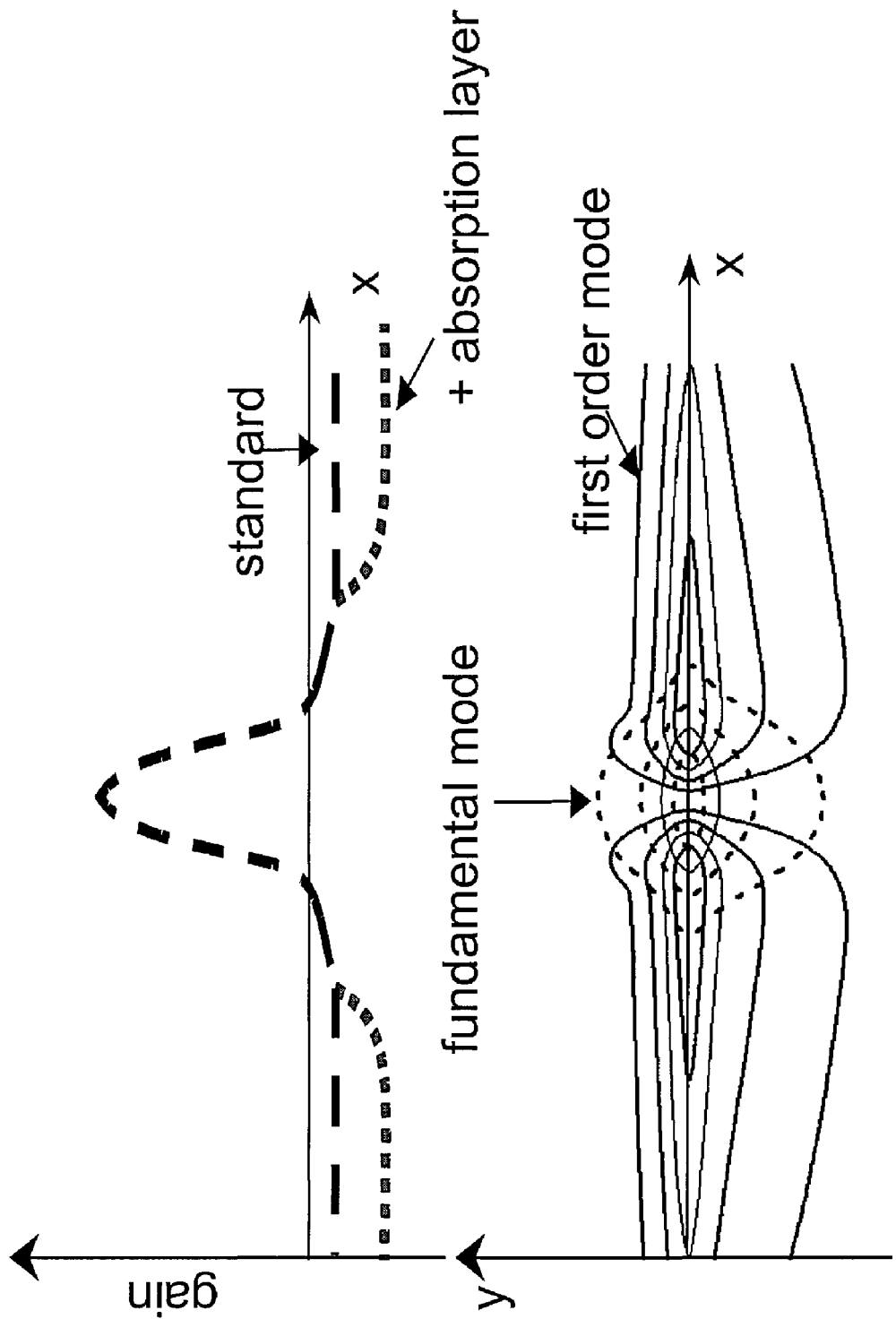
FIG. 1 shows the influence of an absorbing layer on various modes of an RWG laser.

FIG. 1 is a schematic representation of the principle influence of an absorbing layer on various modes of an RWG laser diode. The upper part of FIG. 1 shows the distribution of the "gain" extending over the lateral extension "x" of an RWG laser diode without and with an absorbing layer, the latter according to the invention (dotted lines). As explained above, it is clearly visible that the addition of an absorbing layer reduces the gain in lateral regions, but not in the center region of the diode.

The lower part of FIG. 1 now shows the calculated lateral distribution of the optical energy of the fundamental mode (dotted line) and the first order mode, again over the lateral extension "x" and the vertical extension "y". It is obvious that the first order mode shows a significantly different lateral distribution of its optical energy, in particular shows it a much higher level than the fundamental mode (dotted lines) in the laterally more distant regions and a minimum at the center region. Here, the invention sets in by providing lateral absorbing layers, appropriately positioned parallel to the waveguide, which significantly suppress the first order mode. This in turn leads to an increase in the linear power of the pump laser device since resonant coupling of the first order mode now occurs at higher power levels.

Figure 2:
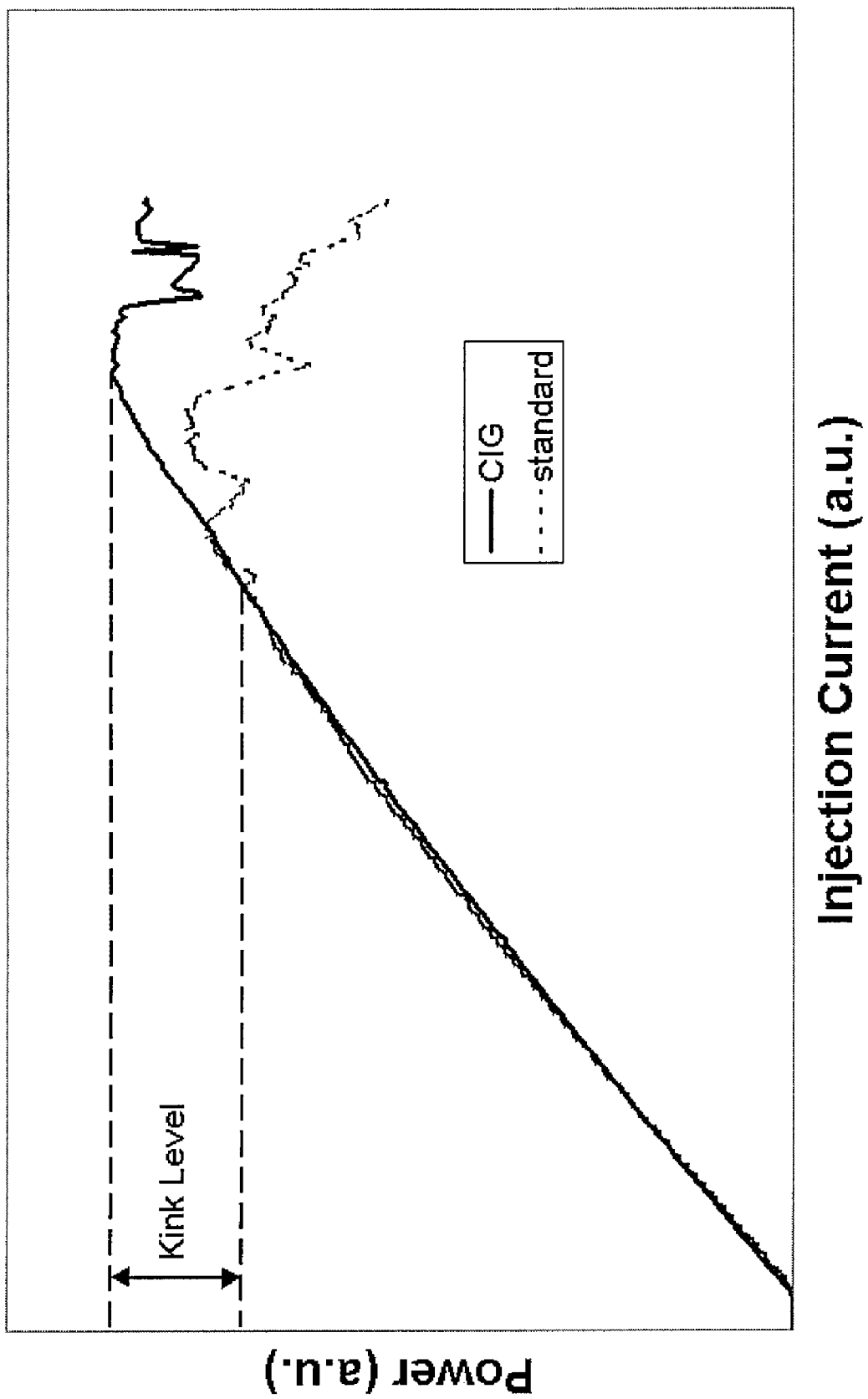
FIG. 2 shows the measured P-I curve of a standard device compared to a CIG-improved device according to the invention.

FIG. 2 illustrates the improvement achieved by adding CIG elements according to the invention to the RWG laser diode structure. The figure shows the P-I curve, i.e. power versus injected current in arbitrary units (a.u.), for a standard diode compared to a CIG-improved diode. Indicated is the first occurring kink, i.e. instability of the optical output power of a standard diode vs. a CIG-improved diode. The first kink clearly occurs at a much lower power level for the standard diode than for the same diode comprising CIG elements. As stated before, stable output powers of more than 900 mW were achieved with the improved CIG design with good life test results. Heretofore, it was difficult or impossible to reach an output power of more than 900 mW with both stability and long life of the laser diodes.

Initially, a manufacturing method of RWG laser diodes according to the invention shall be described since many details will become clear from the preferred manufacturing process. Different stages and variations of this method are illustrated in FIGS. 3a to 9. A person skilled in the art may of course vary this process, e.g. by modifying and/or deleting certain steps and/or by adding further steps, without departing from the invention.

Please note that the figures showing the RWG laser diode are not to scale, in particular are the thicknesses of the various layers greatly exaggerated to make them visible. Please note also that the manufacturing process is only explained with regard to the present invention and is insofar incomplete as those steps and measures known to the person skilled in the art are not mentioned or described.

Figure 3A:
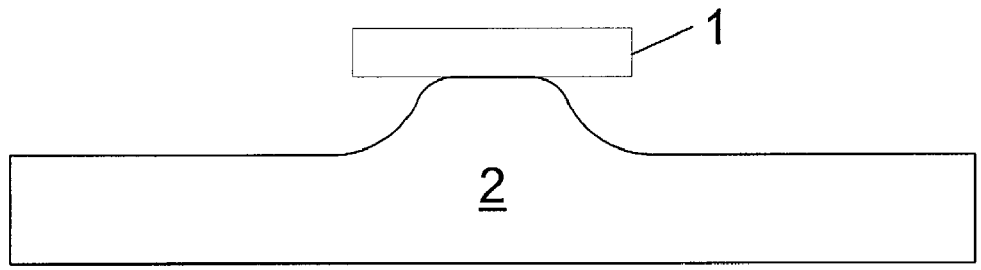
FIGS. 3a-3g illustrate the preferred manufacturing process of an RWG laser diode according to the invention.

FIG. 3a starts with the ridge formation by a wet etching process. The part of a semiconductor body 2 which is supposed to form the ridge of the final RWG laser diode is covered by a photoresist mask 1, the ridge etching mask. GaAs or AlGaAs are the preferred materials for the body 2. However, the process is not limited to these materials, but can be applied also to InP or any other optical semiconductor material. The etching step results in a semiconductor body 2 having the shape shown in FIG. 3a, i.e. the ridge is formed. Here, the shape results from a wet etching process, but the CIG element formation process will work as well on other ridge shapes having, e.g. straight side walls or sidewalls of other shapes. Important for the later described CIG layer self-aligned masking process is only the presence of some kind of a mesa structure.

Figure 3B:
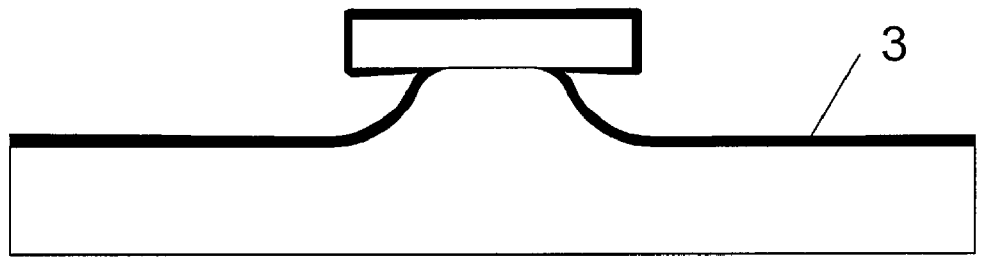

In the next step, shown in FIG. 3b, a thin insulator layer 3, preferably $Si_3N_4$, is deposited across the entire structure. The deposition can be achieved by a PECVD process, i.e. by Physically Enhanced Chemical Vapor Deposition. The thickness of this insulator layer 3 is in the region of 200 to 300 nm, preferably about 220 nm. The insulator layer 3 can also be made of alternative materials, such as $SiO_2$, AlN, or $TiO_2$, and be deposited by alternative deposition methods, such as PVD, i.e. Physical Vapor Deposition, or CVD, i.e. Chemical Vapour Deposition.

Whereas the steps themselves above are more or less state of the art, they form the basis for subsequent steps focusing on the invention.

The steps illustrated in FIGS. 3c to 3g produce the mask that defines the location of the absorbing CIG elements. It is effectively the thick $Si_3N_4$ insulator layer 3 that acts as a mask for the desired absorbing layer. This insulator layer optically separates the light generated in the waveguide from the absorbing layer. In the regions with thick $Si_3N_4$, any absorbing layer deposited on top will not (or only marginally) contribute to the absorption.

Figure 3C:
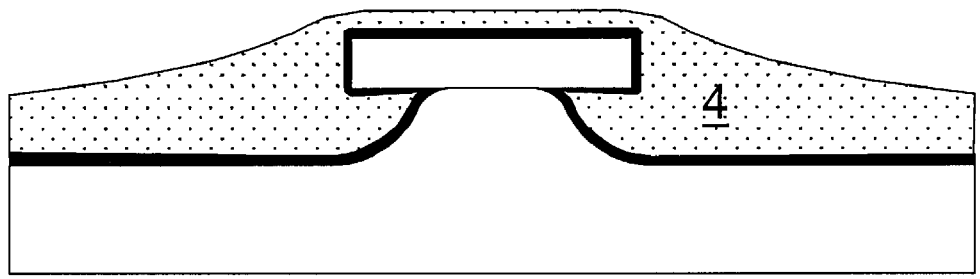

In the step shown in FIG. 3c, a photoresist layer 4 is deposited over the whole semiconductor body 2, including insulator layer 3 and mask 1. Preferably, the photoresist is spun over the semiconductor body 2, resulting in a thicker photoresist layer near the ridge and a thinner photoresist layer in the body region. The thickness of the resulting photoresist layer 4 is preferably about 2.5 μm in the region of the ridge and about 1 μm in the body region. The thickness gradient of the photoresist layer 4 is important for the variability of the absorbing layer (or CIG element) location and shape, as will be shown later. The photoresist deposition of FIG. 3c prepares the device for the subsequent $Si_3N_4$ masking.

To provide the masking necessary for the fabrication the CIG element(s), the photoresist is etched to a desired shape, here specifically a variable width or distance, measured from the ridge center. A preferred method for this shaping step is RIE, i.e. Reactive Ion Etching. This results in the shaping masks 5 illustrated in FIG. 3d. The control of the width of this shaping mask may be facilitated by a rather directional etching process and/or the choice of an appropriate etch time. A person skilled in the art will know how to modify the etching process in order to achieve the desired result.

Figure 3D:
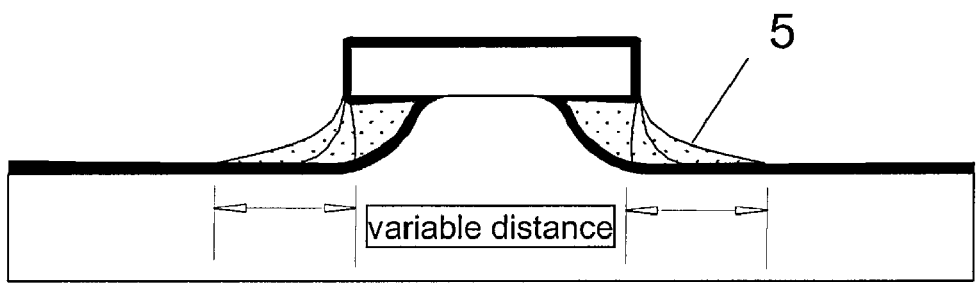

More precisely, FIG. 3d shows three different masks: a narrow one, essentially of the same width as the ridge etching photoresist mask 1; a middle one, somewhat wider than said ridge etching mask 1; and a wide one, identified by the outermost line shown in FIG. 3d. All three widths are shown to clearly demonstrate the variability of the mask.

Figure 3E:
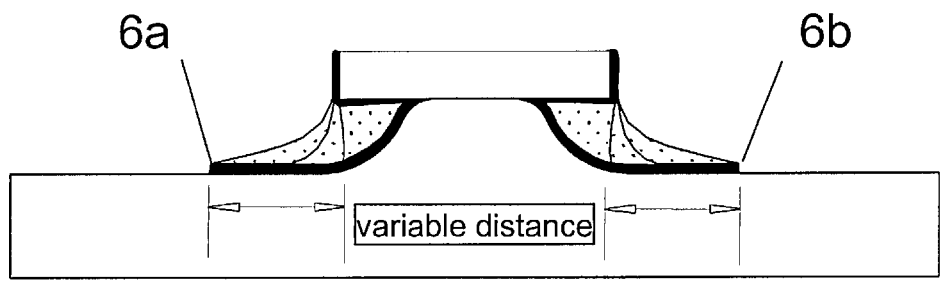

In a subsequent step, shown in FIG. 3e, the insulator layer 3, established earlier as described above with FIG. 3b, is etched down to the semiconductor body 2. After this etching, the insulator layer 3 remains only at the flanks of the ridge and underneath the photoresist mask which was established in the previous step (FIG. 3d) and forms the insulator strips 6a and 6b on both sides of the ridge. They extend preferably along the whole length of the semiconductor body 2, but may be shorter than the latter if desired. The total width of the insulator strips 6a and 6b varies with the width of the shaping mask 5.

The shape of the insulator strips also determines the effective location of the CIG element, i.e. the location where absorption of light mainly occurs.

Figure 3F:
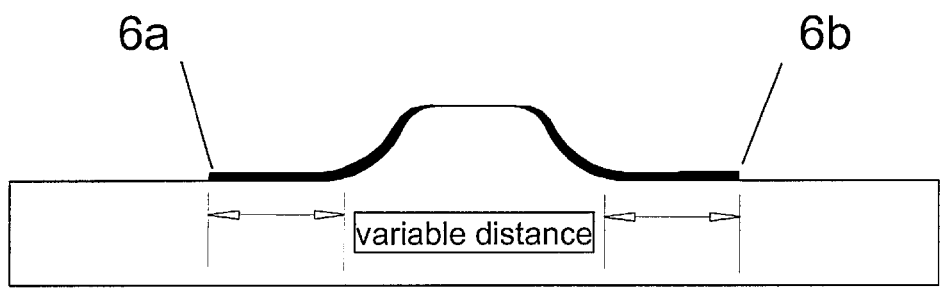

After the etching process described in FIG. 3e, the photoresist shaping mask 5 used for the $Si_3N_4$ or any similar etching as well as the ridge etching photoresist mask 1 are removed, e.g. by lift-off. The result is illustrated in FIG. 3f.

Figure 3G:
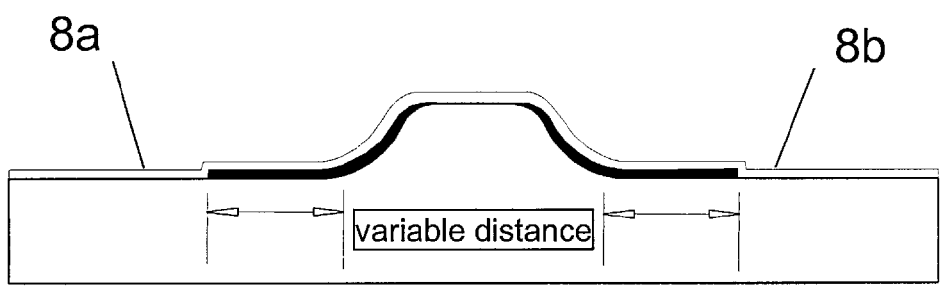

As shown in FIG. 3g, a layer of optically absorbing material, resulting in an uninterrupted layer covering the whole semiconductor body 2 is deposited. This layer has two functions:

It provides the contact layer for the usual P-contact metallisation on top of the ridge.

It provides the absorption necessary for suppressing the undesired first and higher order modes of the laser by forming absorption layers (or CIG elements) 8a and 8b at both sides of the ridge. As stated earlier, the location where absorption takes place, i.e. where the CIG element is effective, is confined to those areas left and right of the ridge where the semiconductor body 2 is not covered by the thick insulator strips 6a and 6b. If desired, the absorption layer may extend over only part of the semiconductor body's length. A person skilled in the art will know how to achieve this.

Consequently, this absorption layer must have two important material properties:

It must be a material in which the imaginary part of the complex refractive index is non-zero for the wavelength in question, i.e. the lasing wavelength.

For the process described, it must also be suitable as a first contact layer for the p-contact metallisation. Conductors such as Ti and Cr are suitable in this case.

Figure 3H:
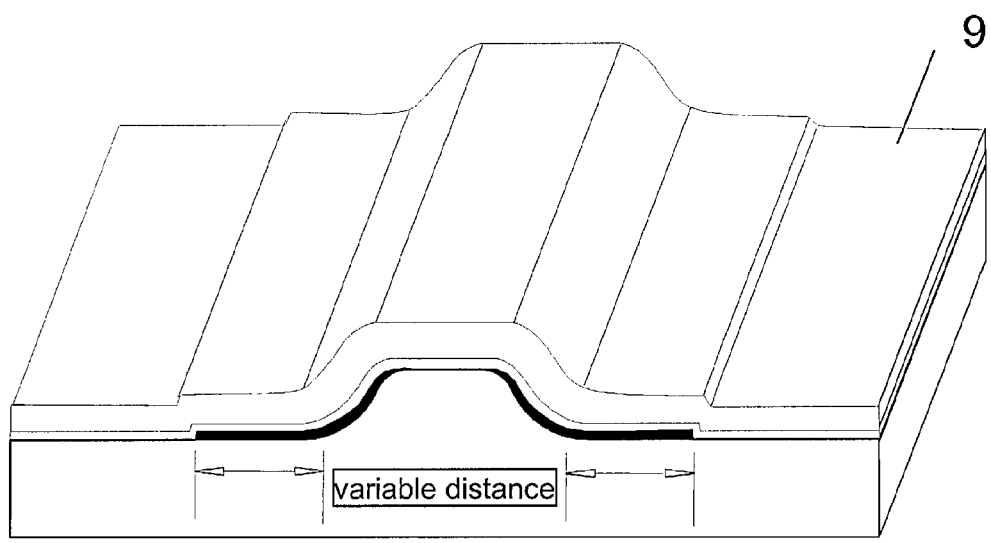
FIG. 3h depicts the structure of a first example of an RWG laser diode according to the invention.

FIG. 3h shows the nearly complete RWG laser diode structure having the additional P-contact layers 9 deposited necessary for electrical powering of the diode.

Any other steps in the manufacturing process to complete the RWG laser diode remain essentially standard and are well known to a person skilled in the art. These steps thus need not be described here.

Figure 3I:
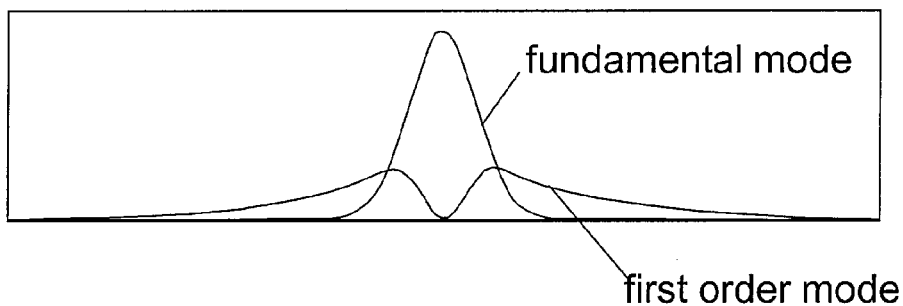
FIG. 3i shows the optical energy distribution of an RWG laser diode according to FIG. 3h.

FIG. 3i finally shows, somewhat similar to FIG. 1, the optical power distribution of the RWG laser diode shown in FIG. 3h approximately in relative dimensions to the structure in FIG. 3h. It is clearly visible that the fundamental mode has its usual peak in the center of the laser diode, whereas the first order mode—as any higher order modes—extend further into the areas where the CIG elements are located. Thus, the first and higher modes are strongly attenuated, which is what the invention intends to achieve.

Depending on the laser design (e.g. ridge shape, epitaxial design) the lateral extension of the modes within the laser diode varies. Accordingly, changes must be made with regard to the optimal location of the CIG elements to achieve the desired maximum absorption of first and higher order modes and minimum absorption of the fundamental mode. It is therefore important to have a process that allows variable placement and shape of the CIG elements independent of, but adapted to, the laser's ridge shape and design. The present invention provides this flexibility and adaptability.

Some alternatives for the deposition and the arrangement of the absorption layer(s) or complex index guiding (CIG) element(s) will be addressed in the following.

Figure 4A:
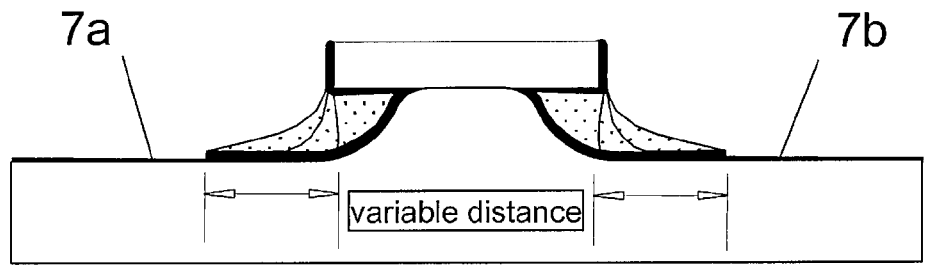
FIGS. 4a-4c illustrate the first alternative manufacturing process of an RWG laser diode according to the invention.

FIGS. 4a to 4d show a first alternative starting after the formation step of mask 5 in FIG. 3d. In this case, the thick insulator layer 3, established earlier as explained above with FIG. 3b, is not etched down to the semiconductor body 2, but to a predetermined thickness on the body. This etching results in relatively thin insulating layers 7a and 7b, as shown in FIG. 4a, extending over the whole of or part of the semiconductor body. Their thickness may be selected in the region of 15 to 40 nm, preferably about 25. The choice depends on the desired overall absorption of the CIG element. Again, the insulator strips 6a and 6b and/or the thin outer insulator layers 7a and 7b extend preferably along the whole length and width of the semiconductor body, but may also be shorter and/or narrower than the latter if desired. The thin outer insulator layers 7a and 7b electrically separate the absorbing material from the semiconductor and thus avoid any undesired leak currents and/or undesired material interactions at the interface. Furthermore, they may be utilized to modify the overall absorption of the CIG element.

Figure 4B:
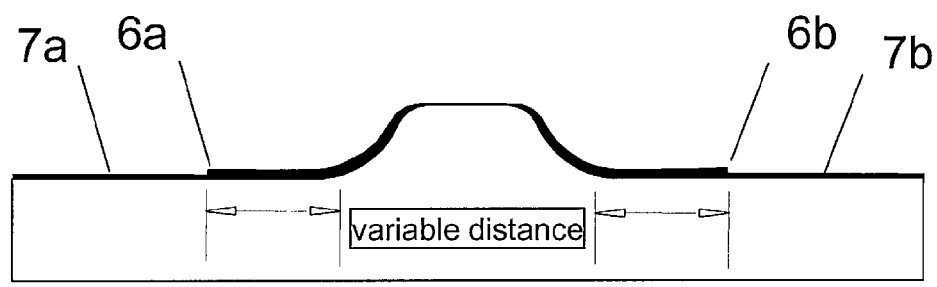
Figure 4C:
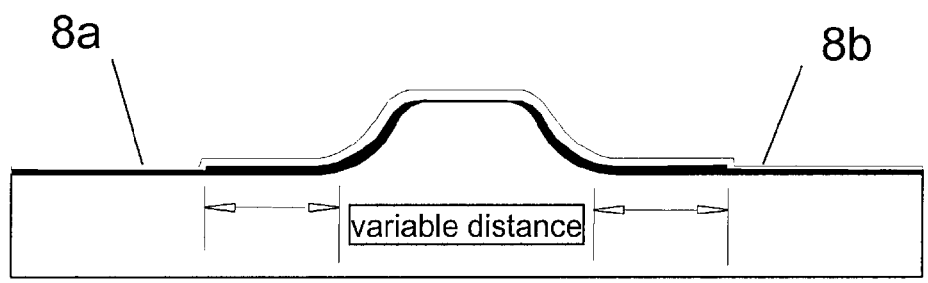

FIG. 4b shows the structure after lift-off of the photoresist masks 1 and 5, as previously described for FIG. 3f. The next step is the deposition of the absorbing layer 8a and 8b as part of the p-metallisation. The result is demonstrated in FIG. 4c and was previously described for FIG. 3g.

Figure 4D:
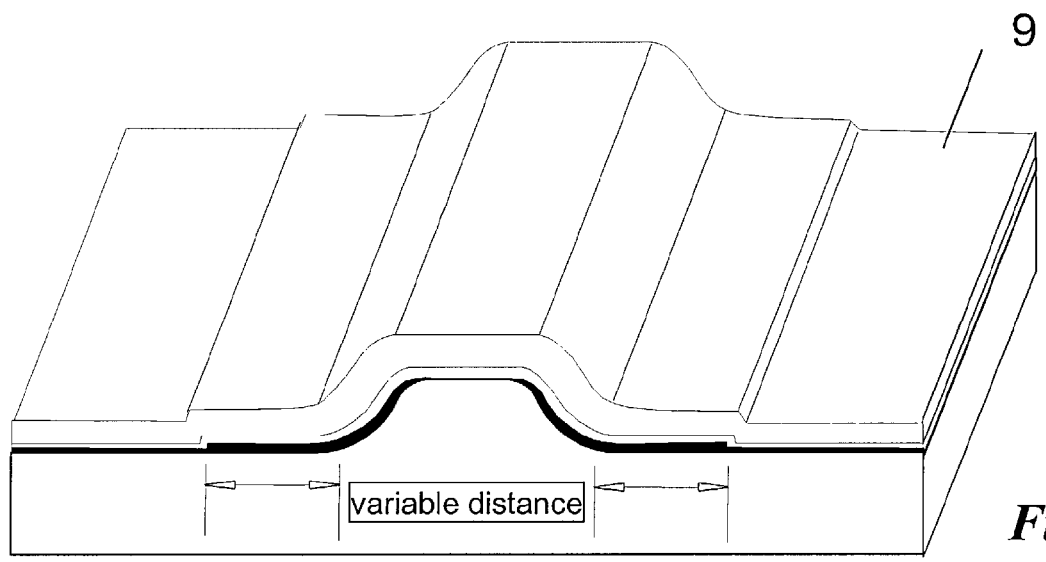
FIG. 4d shows the design of a second example of an RWG laser diode according to the invention.

FIG. 4d shows the nearly complete RWG laser diode structure having the additional P-contact layer 9 deposited necessary for electrical powering of the diode. The CIG elements located left and right of the ridge now consist of two layers: the thin insulating layers 7a and 7b and the optically absorbing layers 8a and 8b.

Figure 5A:
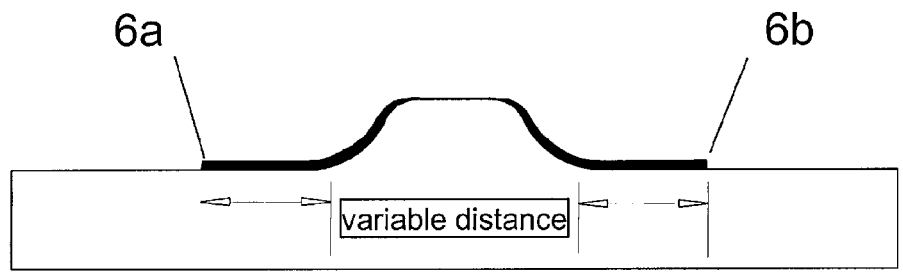
FIGS. 5a-5c illustrate a second alternative manufacturing process of an RWG laser diode according to the invention.

FIGS. 5a to 5d show a second alternative for fabricating a CIG element with an insulation layer underneath the absorbing layer. As described for the first process and shown in FIGS. 3e and 3f, the thick insulating layer is etched down to the semiconductor body 2. The photoresist masks are subsequently removed by lift-off to result in a structure containing the semiconductor body 2 with the ridge and the two thick insulating layers 6a and 6b to both sides of the ridge. This is shown in FIG. 5a.

Figure 5B:
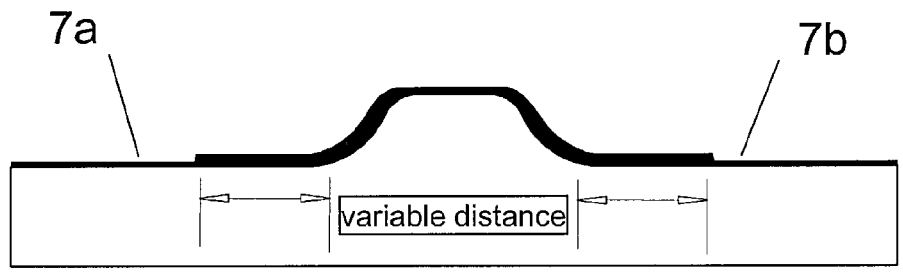

In a next step a thin insulating layer, again preferably 25 nm, is deposited covering the entire semiconductor body 2, thus forming the first layer of the CIG elements 7a and 7b as shown in FIG. 5b. The material can now be chosen and deposited independent of the thick insulating material. Standard materials and deposition methods for this purpose are insulators such as $Si_3N_4$, $TiO_2$, $SiO_2$, AlN deposited by PVD, CVD or MOCVD.

Figure 5C:
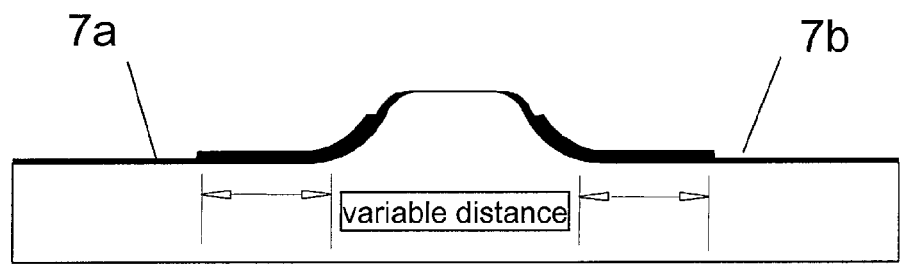

Since this thin insulator covers the entire surface of the semiconductor body, it also covers the contact area on top of the ridge. In this latter area, the thin insulator must be removed to provide electrical contact of the semiconductor with the p-metal. This can be done by any common method with photoresist masks and subsequent etching, preferably RIE etching. A person skilled in the art will know how to realize this. The result is shown in FIG. 5c.

Figure 5D:
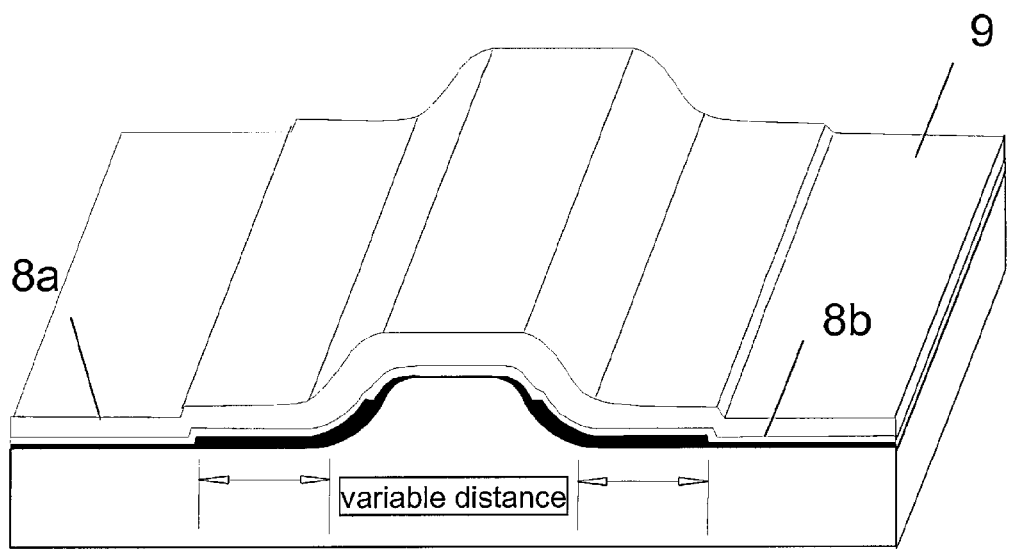
FIG. 5d shows the design of a third example of an RWG laser diode according to the invention.

Finally, the p-metal layer 9, which also provides and functions as the absorption layer of the CIG elements 8a and 8b, is deposited resulting in a structure shown in FIG. 5d.

Figure 6A:
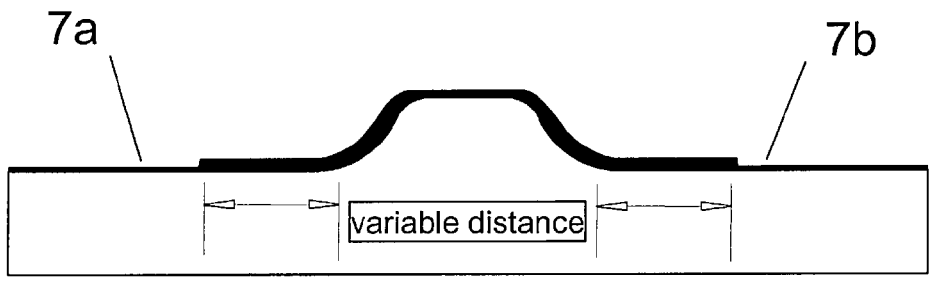
FIGS. 6a-6c illustrate a third alternative manufacturing process of an RWG laser diode according to the invention.

The third alternative process is similar to the previous one, but allows the utilization of different materials for the CIG element independent of the thick insulating layer(s) and the p-metal layer. FIG. 6a shows the structure with the thick insulating layers 6a and 6b at both sides of the ridge and the thin insulating layer 7a/b deposited across the entire semiconductor surface. This structure is generated in the same manner as described earlier for FIG. 5b.

Figure 6B:
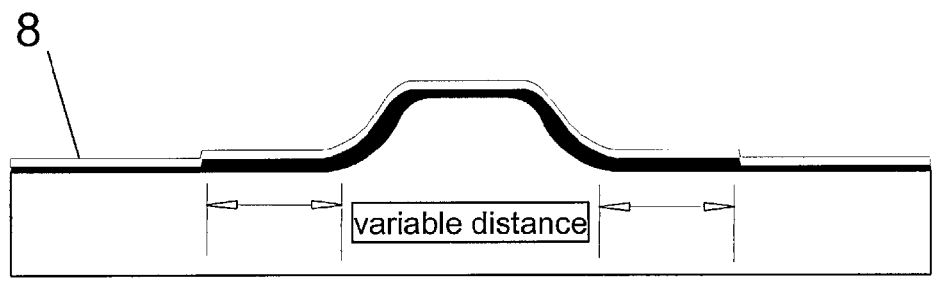
Figure 6C:
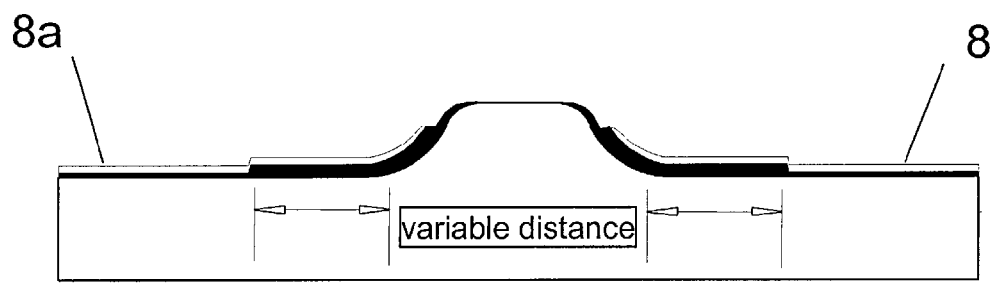

In a next step, an absorption layer is deposited, also covering the entire body and forming the necessary absorption layers for the CIG elements. This is shown in FIG. 6b. As in the process described previously with FIGS. 5a to 5d, the two layers forming the CIG element 7a/b and 8a/b must be removed from the p-contact area. This is again done by any common masking and subsequent etching step and results in the structure shown in FIG. 6c.

Figure 6D:
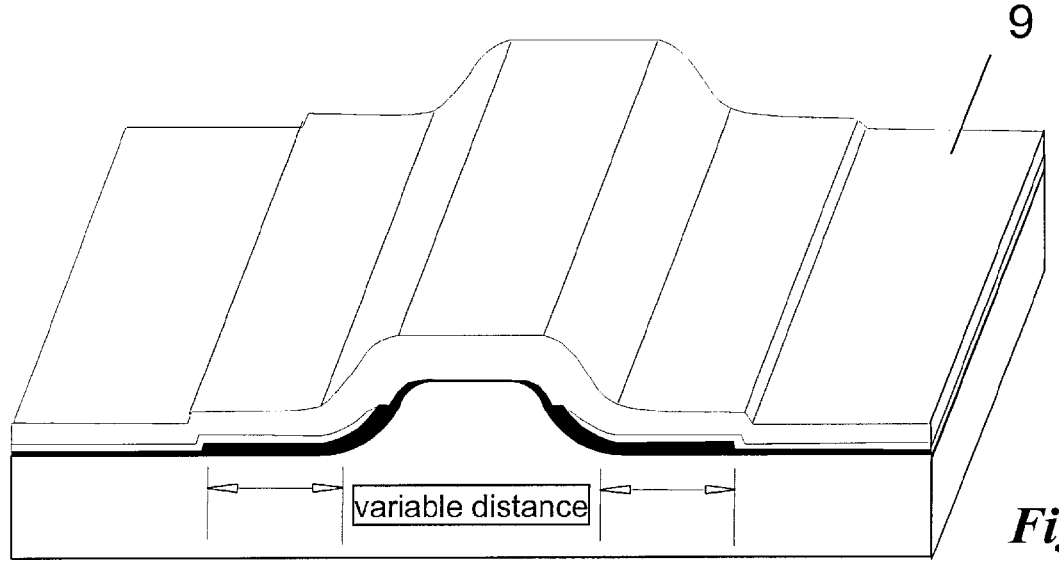
FIG. 6d shows the design of a fourth example of an RWG laser diode according to the invention.

FIG. 6d finally shows the RWG structure after deposition of the p-metallisation, i.e. the p-contact layer 9. The advantage of the process described last is the ability to choose any stack of materials for the CIG element composition independent of p-metallisation. The only requirement for the absorption layer remains now the absorption property at the lasing wavelength. In the previously described processes, the choice of materials was limited to materials providing good contact to the semiconductor, preferably a conductor of the type Ti, Cr, Pt. For this last process however, any material and thickness can be used as long as the material provides absorption at the lasing wavelength. Additionally the CIG element can be modified to any shape to cover only part of the semiconductor body.

Figure 7A:
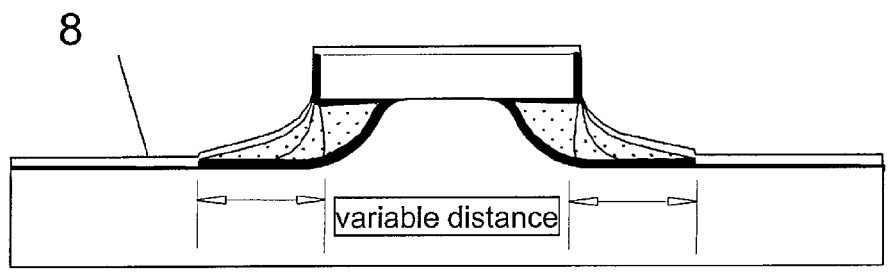
FIGS. 7a-7b illustrate a fourth alternative manufacturing process of an RWG laser diode according to the invention.
Figure 7B:
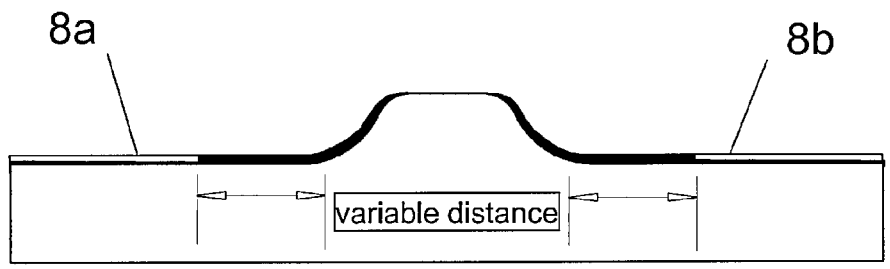
Figure 7C:
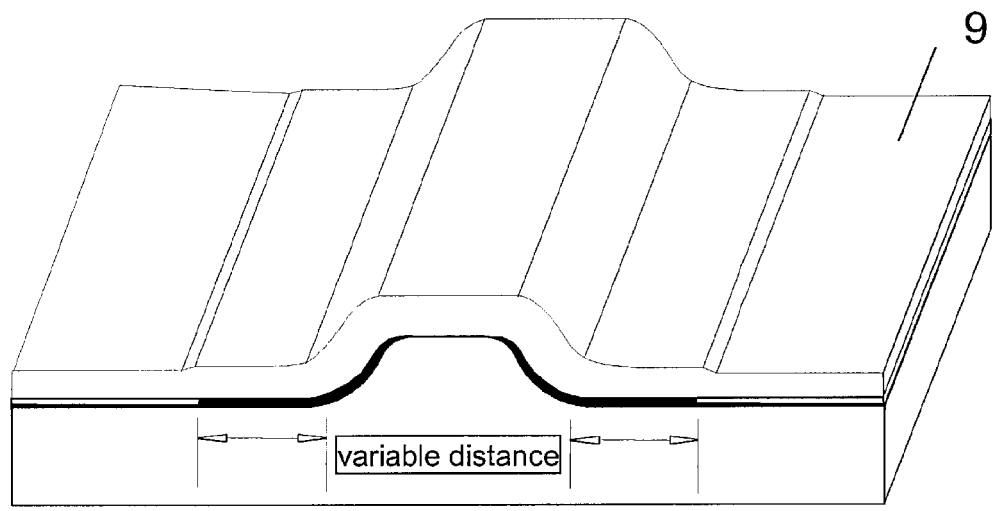
FIG. 7c shows the design of a fifth example of an RWG laser diode according to the invention.

A fourth alternative is described in FIGS. 7a to 7c. Starting from a structure as in FIG. 3e or 4a, an absorption layer 8 is deposited over the semiconductor body 2, including both the ridge etching mask 1 and the photoresist shaping masks 5. This is shown in FIG. 7a. When the photoresist masks are now lifted off, CIG elements 8a and 8b remain, extending over the semiconductor body except the ridge and its vicinity, i.e. the insulator strips 6a, 6b and 7a, 7b. The result, shown in FIG. 7b, are two separate CIG elements 8a and 8b. Again, if desired, the absorption layer may extend over only part of the semiconductor body. A person skilled in the art will know how to achieve this.

FIG. 7c shows the structure after lifting-off the masks and depositing the usual P-contact metallisation layer 9. The advantage of this alternative is that material and thickness for the P-contact metallization and the CIG element can be chosen independently. In contrast to the previously described process, cf. FIGS. 6a-6c, the contact areas do not have to be opened in a separate step. This is facilitated by the lift-off step also used for structuring the CIG elements.

Figure 8A:
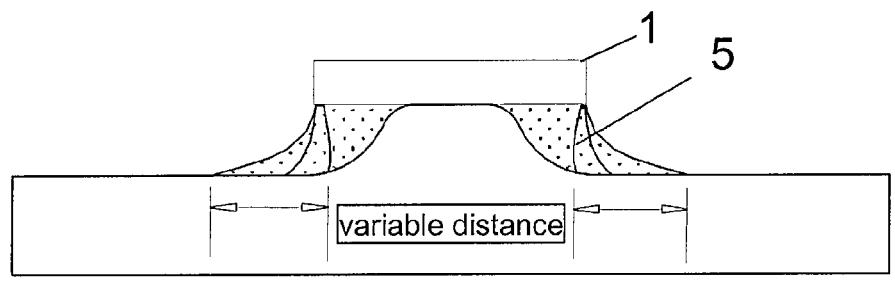
FIGS. 8a-8d illustrate a sixth alternative manufacturing process of an RWG laser diode according to the invention.
Figure 8B:
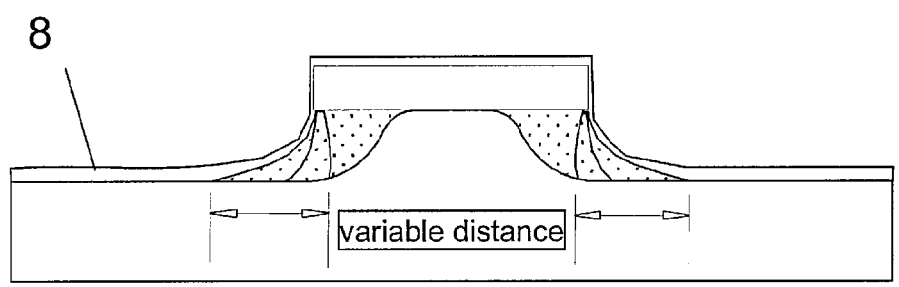
Figure 8C:
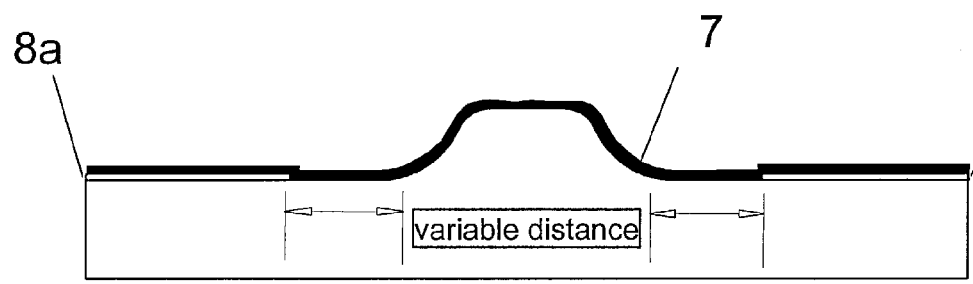
Figure 8D:
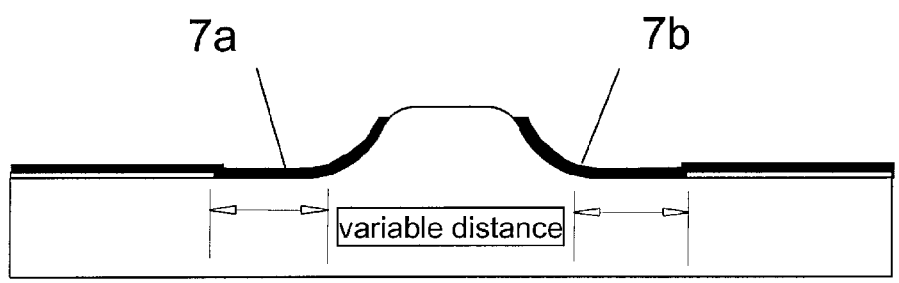
Figure 8E:
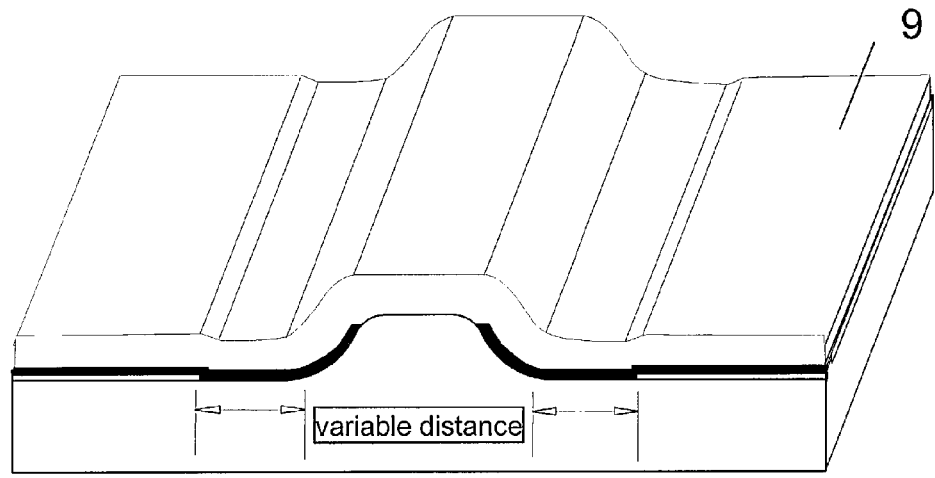
FIG. 8e shows the design of a sixth example of an RWG laser diode according to the invention.

FIGS. 8a to 8c show a fifth alternative process for fabricating a high power laser with CIG elements. Here, as shown in FIG. 8a, the mask providing the variable distance from the ridge is fabricated directly after ridge etching. Subsequently, the absorption layer 8 is deposited as part of the CIG element, as shown in FIG. 8b. Following this stage, further layers may be deposited, being absorbing and/or non-absorbing layers. Both masks 1 and 5 are lifted off resulting in the CIG elements 8a and 8b. Then the insulating layer 7 is deposited, shown in FIG. 8c. Finally the P-contact area is opened on top of the ridge by any state-of-the-art method, such as photoresist masking and RIE etching and the P-metallization deposited, as shown in FIGS. 8d and 8e. FIG. 8e shows the almost finished device, including the P-contact 9. A person skilled in the art knows how to execute these steps, so they need not be described here in detail. Similar to the methods describes above, a stack of alternating absorption and insulation layers may be deposited, resulting in a layered structure of the CIG element(s).

Figure 9:
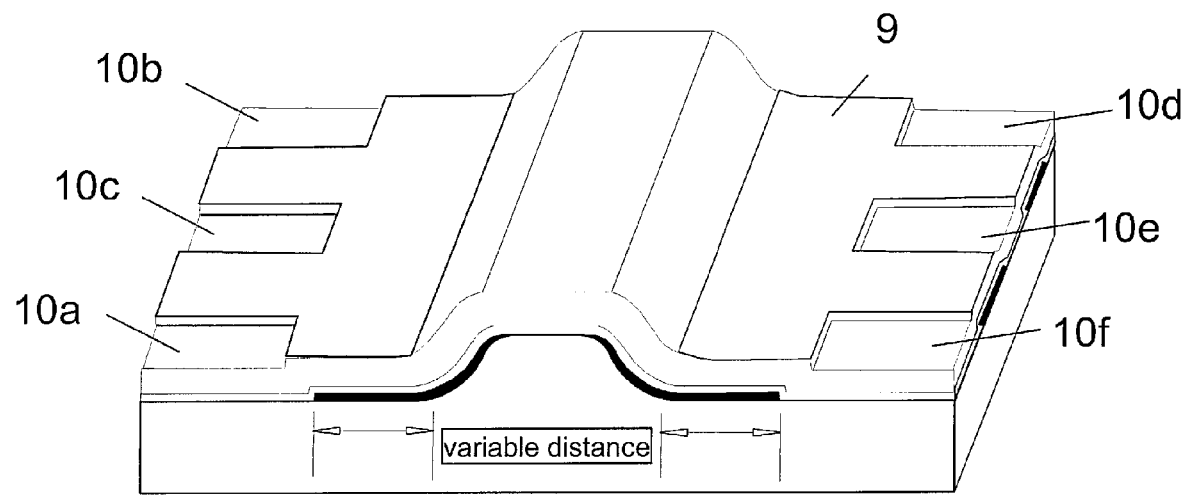
FIG. 9 shows the design of a seventh example of an RWG laser diode according to the invention.

FIG. 9 shows a laser device having multiple CIG elements 10a to 10f. The limitation of the CIG area perpendicular to the optical axis of the laser is facilitated by any of the above processes, as described in connection with the FIGS. 3 to 8. The limitation of the CIG area along the optical axis of the device can be achieved by any state of the art masking and etching or masking and deposition process. Such limitation of the CIG area provides a further degree of control in governing the level of absorption experienced by different optical modes. The limitation of the CIG areas is a technique that is applicable to all of the different designs illustrated in the present application. Again, a person skilled in the art will easily see how to fabricate such a device.

Any of the above described embodiments my be applied to a laser diode of the so-called "straight-flared-straight" structure as disclosed in Pawlik et al. U.S. Pat. No. 6,798,815, assigned to the assignee of the present invention and incorporated herein by reference.

Further modifications will readily occur to a person skilled in the art and the invention is therefore not limited to the specific embodiments, details, and steps shown and described hereinbefore. Modifications may be made without departing from the spirit and scope of the general inventive concepts as defined in the appended claims.

The invention claimed is:

1. A high power laser diode comprising:
    a semiconductor body,
    an active region,
    a lower cladding layer,
    an upper cladding layer with a ridge waveguide,
    a top metallization for current injection,
    said laser diode further including a structure of optically absorbing elements constituting part of one or more complex index guiding (CIG) elements for suppressing first and higher order modes of said laser diode, each said optically absorbing element extending along the length of said semiconductor body with a predetermined width across said semiconductor body, said predetermined width of said optically absorbing element varying along the length of said semiconductor body.

2. The laser diode according to claim 1, wherein
    the optically absorbing element has a first width extending along a first fraction of the length of the semiconductor body and a second width, wider than said first width, extending along a second fraction of the length of said semiconductor body.

3. The laser diode according to claim 1, wherein
    each CIG element comprises an absorption layer and an insulation layer, said insulation layer being provided on at least part of the upper cladding layer separating at least part of said absorption layer from said laser semiconductor body, said insulation layer having a predetermined thickness with a maximum close to said ridge waveguide and a minimum distant from said ridge waveguide.

4. The laser diode according to claim 1, wherein
    two CIG elements are provided and arranged symmetrically on either side of the ridge waveguide.

5. The laser diode according to claim 1, wherein
    the insulation layer separating the absorption layer from the semiconductor body exhibits two sections each of essentially constant thickness, a first, greater thickness close to the ridge waveguide and a second, smaller thickness distant from the ridge waveguide.

6. The laser diode according to claim 1, wherein
    the CIG element comprises a plurality or stack of insulating and absorbing layers.

7. The laser diode according to claim 1, wherein
    at least two CIG elements are provided as layer structures located on either side of the ridge waveguide and extending along the whole length of the semiconductor body.

8. The laser diode according to claim 1, wherein
    at least two CIG elements are provided as layer structures located on either side of the ridge waveguide and extending only partially along the length of the semiconductor body.

9. The laser diode according to claim 1, wherein the CIG element is shaped to maximize suppression of first and higher order modes while minimizing absorption of the fundamental mode.

10. The laser diode according to claim 5, wherein the thickness of the insulator between the semiconductor body and the absorbing layer is being selected to minimize absorption of the fundamental mode while maximizing suppression of first and higher order modes.

11. The laser diode according to claim 5, wherein the thickness of the absorption layer is being selected to maximize suppression of first and higher order modes while minimizing absorption of the fundamental mode.

12. The laser diode according to claim 5, wherein the material of the absorption layer is being selected to maximize suppression of first and higher order modes while minimizing absorption of the fundamental mode.

13. The laser diode according to claim 8, wherein materials and thickness for the CIG element are being selected to maximize suppression of first and higher order modes while minimizing absorption of the fundamental mode.

14. The laser diode according to claim 1, wherein the absorption layer of the CIG element covers at least a large part of the semiconductor body.

15. The laser diode according to claim 14, wherein the absorbing layer of the complex index guiding element further serves as a contact layer for said laser's ridge waveguide.

16. The laser diode according to claim 1, wherein the semiconductor body is of at least one of GaAs and InP based materials and the complex index guiding element comprises a conductor or a semiconductor including at least one of Ti, Cr, Pt, Au, and Si.

17. The laser diode according to claim 1, wherein the semiconductor body is of at least one of GaAs and InP based materials and the complex index guiding element comprises an insulator, including at least one of $TiO_2$, $Si_3N_4$, AlN, and $SiO_2$.

18. The laser diode according to claim 5, wherein the two sections of the absorption layer abut against a common shoulder which is self-aligned with the ridge waveguide.

19. The laser diode according to claim 1, wherein the insulation layer separates the absorption layer from the laser semiconductor body in the vicinity of the ridge waveguide only and with an essentially constant thickness.

20. A high power laser diode comprising a semiconductor body, a ridge waveguide, an active region, and a structure of optically absorbing elements for suppressing selected modes of said laser diode, said structure constituting part of one or more complex index guiding (CIG) elements, each said optically absorbing element extending along the length of said semiconductor body with a predetermined width across said semiconductor body, said width of said optically absorbing element varying along the length of said semiconductor body, said laser diode having front and back facets and, extending between said facets, said ridge waveguide having:
a center segment with a substantially constant first cross section, preferably having a length of 40-70% of the diode length,
two tapered segments extending and widening from the center segment towards said facets in opposite direction, and
two end segments between said tapered segments and said facets, each said end segment having a substantially constant cross section larger than said first cross section,
in particular a first one of said tapered segments having a length of about 30-60% of the diode length and a second one of said tapered segments having a length of up to 10% of the diode length.

21. The laser diode according to claim 20, wherein the optically absorbing element has a first width extending along a first fraction of the length of the semiconductor body and a second width, wider than said first width, extending along a second fraction of the length of said semiconductor body.

22. The laser diode according to claim 20, wherein each CIG element comprises an absorption layer and an insulation layer, said insulation layer being provided on at least part of the upper cladding layer separating at least part of said absorption layer from said laser semiconductor body, said insulation layer having a predetermined thickness with a maximum close to said ridge waveguide and a minimum distant from said ridge waveguide.

23. The laser diode according to claim 20, wherein two CIG elements are provided and arranged symmetrically on either side of the ridge waveguide.

24. The laser diode according to claim 20, wherein the insulation layer separating the absorption layer from the semiconductor body exhibits two sections each of essentially constant thickness, a first, greater thickness close to the ridge waveguide and a second, smaller thickness distant from the ridge waveguide.

25. The laser diode according to claim 20, wherein the CIG element comprises a plurality or a stack of insulating and absorbing layers.

* * * * *